United States Patent
Denison et al.

(10) Patent No.: US 9,224,854 B2
(45) Date of Patent: Dec. 29, 2015

(54) TRENCH GATE TRENCH FIELD PLATE VERTICAL MOSFET

(71) Applicant: Texas Instruments Incorporated, Dallas, TX (US)

(72) Inventors: Marie Denison, Plano, TX (US); Sameer Pendharkar, Allen, TX (US); Guru Mathur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 91 days.

(21) Appl. No.: 14/044,915

(22) Filed: Oct. 3, 2013

(65) Prior Publication Data

US 2015/0097230 A1   Apr. 9, 2015

(51) Int. Cl.
- *H01L 29/78* (2006.01)
- *H01L 29/66* (2006.01)
- *H01L 29/10* (2006.01)
- *H01L 29/08* (2006.01)

(52) U.S. Cl.
CPC ........ *H01L 29/7813* (2013.01); *H01L 29/0882* (2013.01); *H01L 29/1095* (2013.01); *H01L 29/66734* (2013.01)

(58) Field of Classification Search
CPC .................................................. H01L 29/66734
USPC .......................................................... 257/334
See application file for complete search history.

(56) References Cited

U.S. PATENT DOCUMENTS

| | | | | |
|---|---|---|---|---|
| 7,364,971 | B2 * | 4/2008 | Yamaguchi et al. | 438/268 |
| 2011/0210391 | A1 * | 9/2011 | Kitagawa | 257/331 |
| 2013/0307062 | A1 * | 11/2013 | Meiser et al. | 257/330 |
| 2014/0077342 | A1 * | 3/2014 | He et al. | 257/629 |

* cited by examiner

*Primary Examiner* — Chandra Chaudhari
(74) *Attorney, Agent, or Firm* — Jacqueline J. Garner; Frank D. Cimino

(57) ABSTRACT

A semiconductor device having a vertical drain extended MOS transistor may be formed by forming deep trench structures to define vertical drift regions of the transistor, so that each vertical drift region is bounded on at least two opposite sides by the deep trench structures. The deep trench structures are spaced so as to form RESURF regions for the drift region. Trench gates are formed in trenches in the substrate over the vertical drift regions. The body regions are located in the substrate over the vertical drift regions.

10 Claims, 18 Drawing Sheets

TRENCH GATE TRENCH FIELD PLATE VERTICAL MOSFET

FIELD OF THE INVENTION

This invention relates to the field of semiconductor devices. More particularly, this invention relates to drain extended transistors in semiconductor devices.

BACKGROUND OF THE INVENTION

An extended drain metal oxide semiconductor (MOS) transistor may be characterized by the resistance of the transistor in the on state, the lateral area which the transistor occupies at the top surface of the substrate containing the transistor, and the breakdown potential between the drain node and the source node of the transistor which limits the maximum operating potential of the transistor. It may be desirable to reduce the area of the transistor for given values of the on-state resistance and the breakdown potential. One technique to reduce the area is to configure the drift region in the extended drain in a vertical orientation, so that drain current in the drift region flows perpendicularly to the top surface of the substrate. Integrating a vertically oriented drift region in a semiconductor device using planar processing while maintaining desired fabrication cost and complexity may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device having a vertical drain extended MOS transistor may be formed by forming deep trench structures to define at least one vertical drift region of the transistor. The vertical drift regions are bounded on at least two opposite sides by said deep trench structures. The deep trench structures are spaced so as to form RESURF regions for the drift region. Trench gates are formed in trenches in the substrate over the vertical drift regions. An optional buried drain contact layer may connect to the vertical drift regions to provide drain connections, or vertical drain contact regions which are adjacent to the vertical drift regions may provide drain connections.

DETAILED DESCRIPTION OF EXAMPLE EMBODIMENTS

The following co-pending patent applications contain related matter and are incorporated by reference: U.S. patent application Ser. No. 14/044,909 entitled "TRENCH GATE TRENCH FIELD PLATE SEMI-VERTICAL SEMI-LATERAL MOSFET;" and U.S. patent application Ser. No. 14/044,926 entitled "VERTICAL TRENCH MOSFET DEVICE IN INTEGRATED POWER TECHNOLOGIES."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device having a vertical drain extended MOS transistor may be formed by forming deep trench structures to define at least one vertical drift region of the transistor. The vertical drift regions are bounded on at least two opposite sides by said deep trench structures. The deep trench structures are spaced so as to form RESURF regions for the drift region. Trench gates are formed in trenches in the substrate over the vertical drift regions. An optional buried drain contact layer may connect to the vertical drift regions to provide drain connections, or vertical drain contact regions which are adjacent to the vertical drift regions may provide drain connections. The semiconductor device may be, in one example, an integrated circuit containing the vertical drain extended MOS transistor and other transistors. The semiconductor device may be, in another example, a discrete device in which the vertical drain extended MOS transistor is the only transistor. A vertical drain contact region may possibly be disposed between adjacent portions of the deep trench structures.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et al., "Thin Layer High Voltage Devices" Philips J, Res. 35 1-13, 1980.

Figure 1:
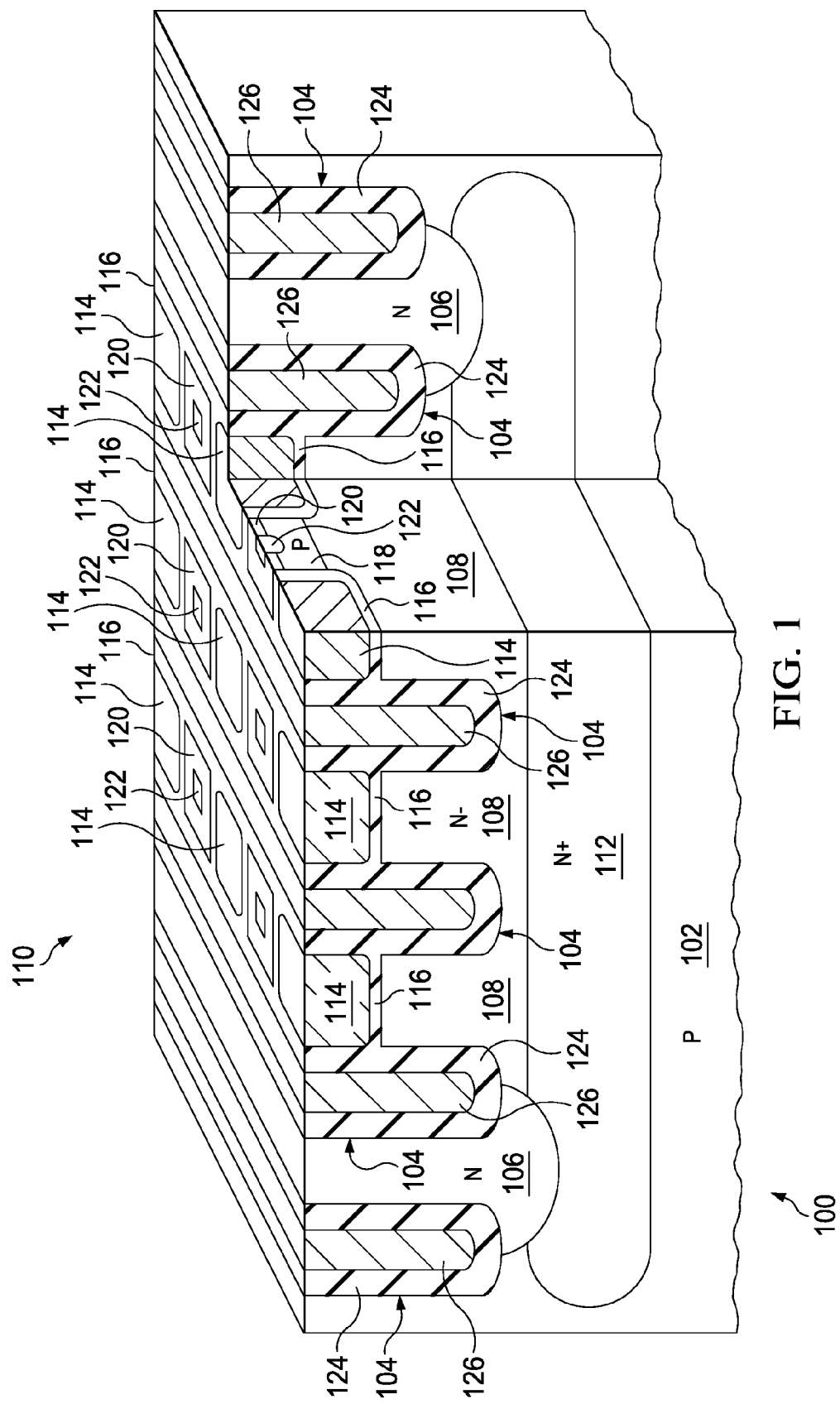
FIG. 1 is a cross section of a semiconductor device having a vertical drain extended MOS transistor.

The examples described in this disclosure describe n-channel devices. It will be recognized that corresponding p-channel devices may be formed by appropriate changes in doping polarities. FIG. 1 is a cross section of a semiconductor device having a vertical drain extended MOS transistor. The semiconductor device 100 is formed in and on a p-type semiconductor substrate 102. The vertical drain extended MOS transistor 110 includes a plurality of deep trench structures 104 disposed in the substrate 102 so as to define at least one n-type vertical drain contact region 106 and a plurality of adjacent n-type vertically oriented drift regions 108 separated by instances of the deep trench structures 104. The at least one vertical drain contact region 106 and the vertically oriented drift regions 108 contact an n-type buried layer 112 disposed in the substrate 102. The deep trench structures 104 are all substantially equal in depth.

Trench gates 114 and corresponding gate dielectric layers 116 are disposed in trenches in the vertically oriented drift regions 108, so that top portions of the vertically oriented drift regions 108 contact bottom portions of the gate dielectric layers 116. The trench gates 114 may extend across the vertically oriented drift regions 108 and abut the deep trench structures 104 on opposite sides of the vertically oriented drift regions 108, as shown in FIG. 1. At least one p-type body region 118 is disposed in the substrate 102 over the vertically oriented drift regions 108 and contacting the gate dielectric layers 116. N-type source regions 120 are disposed in the substrate 102 contacting the at least one p-type body region 118 and the gate dielectric layers 116. Optional p-type body contact regions 122 may be disposed in the substrate 102 contacting the at least one p-type body region 118. Top surfaces of the trench gates 114 are substantially even with a top surface of the substrate 102; this may be accomplished, for example, using a chemical mechanical polish (CMP) process. It will be recognized that other configurations of trench gates may be used in the vertical drain extended MOS transistor 110 with the configuration of deep trench structures 104, vertical drain contact regions 106 and vertically oriented drift regions 108 depicted in FIG. 1.

The deep trench structures 104 are 1 to 5 microns deep, and 0.5 to 1.5 microns wide. For example, deep trench structures 104 which are 2.5 microns deep may provide 30 volt operation for the vertical drain extended MOS transistor 110. Deep trench structures 104 which are 4 microns deep may provide 50 volt operation for the vertical drain extended MOS transistor 110. The deep trench structures 104 have dielectric liners 124 and may have optional electrically conductive central members 126. Instances of the deep trench structures 104 abutting the vertically oriented drift regions 108 are spaced 0.5 to 2 microns apart so as to provide RESURF regions for the vertically oriented drift regions 108. Instances of the deep trench structures 104 abutting the vertical drain contact region 106 may be spaced, for example, 0.5 to 2.5 microns apart. During operation of the vertical drain extended MOS transistor 110, the electrically conductive central members 126, if present, may be electrically biased to reduce a peak electric field in the vertically oriented drift regions 108. For example, the electrically conductive central members 126 may be connected to source regions 120, to the trench gates 114 or to a bias source having a desired potential.

Figure 2A:
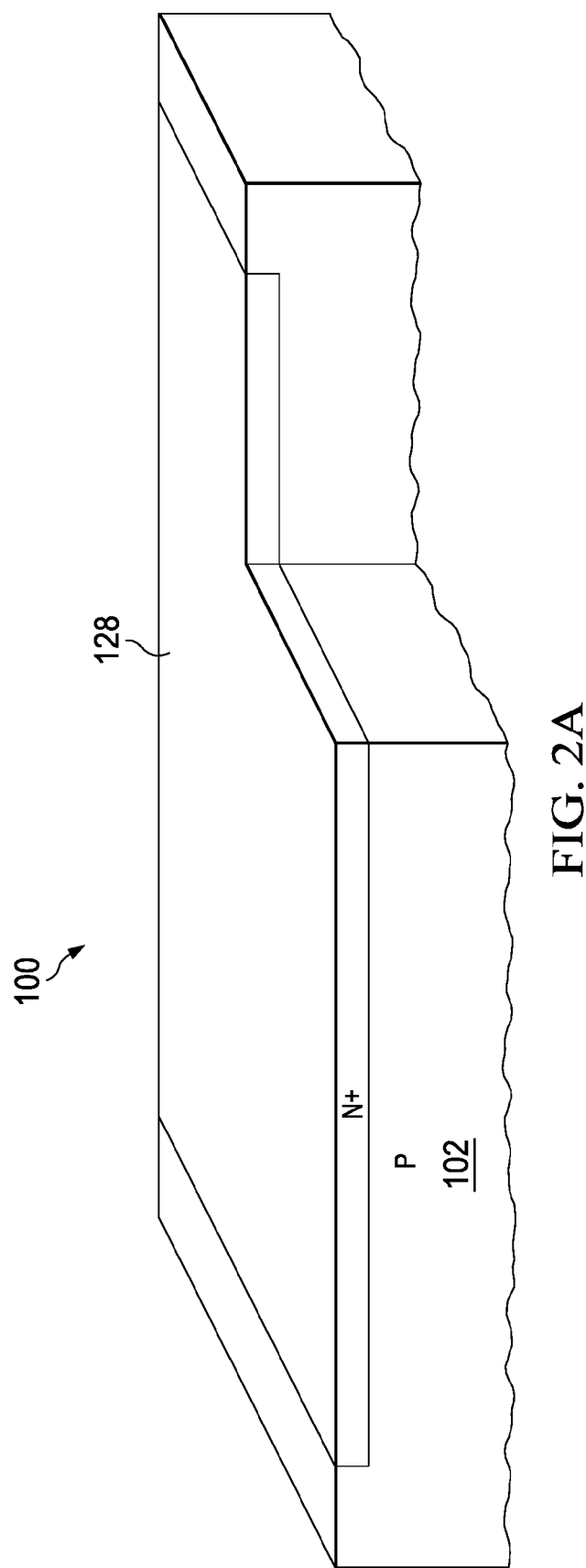
FIG. 2A through FIG. 2H are cross sections of the semiconductor device of FIG. 1, depicted in successive stages of fabrication.

FIG. 2A through FIG. 2H are cross sections of the semiconductor device of FIG. 1, depicted in successive stages of fabrication. Referring to FIG. 2A, an n-type buried layer implanted region 128 is formed in the substrate 102 in an area defined for the n-type buried layer 112 of FIG. 1, for example by implanting antimony at a dose of $1 \times 10^{15}$ cm$^{-2}$ to $5 \times 10^{15}$ cm$^{-2}$ at 30 keV to 100 keV using an implant mask.

Figure 2B:
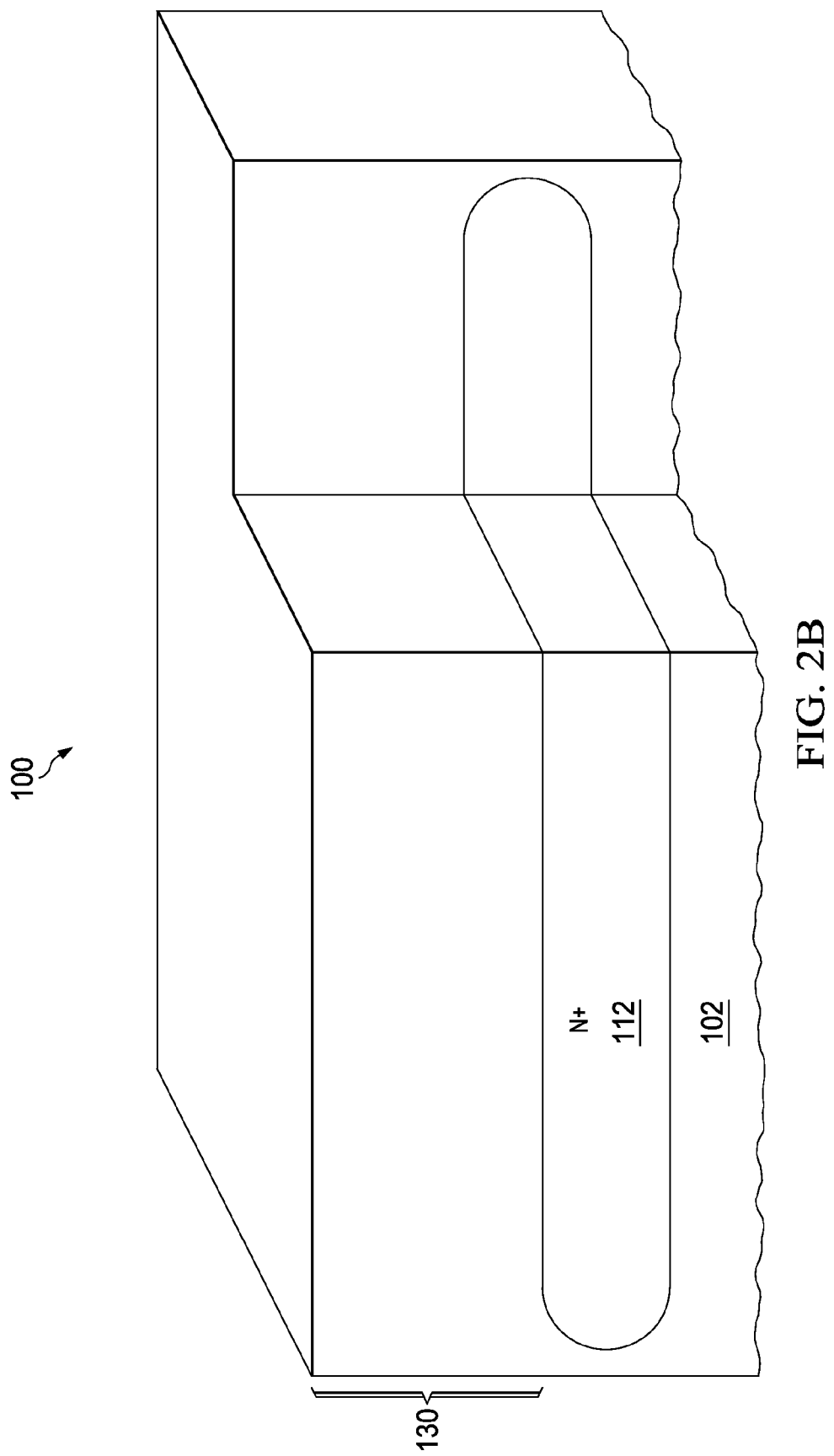

Referring to FIG. 2B, a thermal drive operation and a p-type epitaxial growth operation are performed which diffuses and activates the implanted n-type dopants in the buried layer implanted region 128 to form the n-type buried layer 112 and form a p-type epitaxial layer 130 of the substrate 102 over the n-type buried layer 112. The epitaxial layer 130 may be, for example, 3 to 6 microns thick.

Figure 2C:
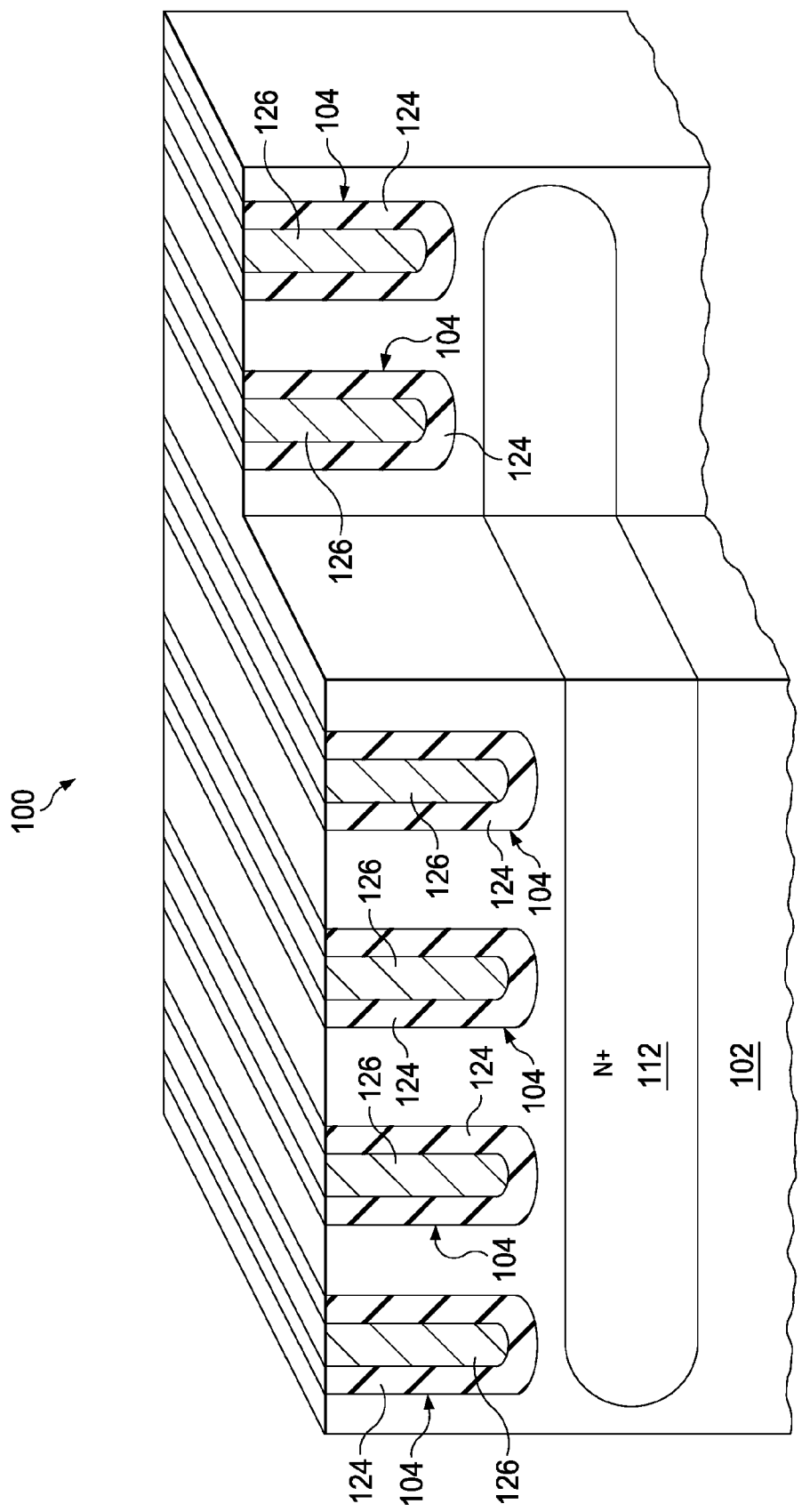

Referring to FIG. 2C, the deep trench structures 104 are formed by etching deep isolation trenches in the substrate, forming the dielectric liners 124 and subsequently optionally forming the electrically conductive central members 126. The deep isolation trenches may be formed, for example, by a process stating with forming a layer of hard mask material over the top surface of the substrate 102. A hard mask may be formed by forming an etch mask by a photolithographic followed by removing the hard mask material over regions defined for the deep isolation trenches using a reactive ion etch (RIE) process. After patterning the hard mask, material is removed from the substrate 102 in the deep isolation trenches using an anisotropic etch process, such as a Bosch deep RIE process or a continuous deep RIE process.

The dielectric liners 124 may include, for example, thermally grown silicon dioxide. The dielectric liners 124 may also include one or more layers of dielectric material such as silicon dioxide, silicon nitride and/or silicon oxynitride, formed by a chemical vapor deposition (CVD) process. The electrically conductive central members 126, if included in the vertical drain extended MOS transistor 110, are formed on the dielectric liners 124. The electrically conductive central members 126 may include, for example, polycrystalline silicon, commonly referred to as polysilicon, formed by thermally decomposing SiH4 gas inside a low-pressure reactor at a temperature of 580° C. to 650° C. The polysilicon may be doped during formation to provide a desired electrical resistance. The filled deep isolation trenches form the deep trench structures 104. Unwanted dielectric material over the top surface of the substrate 102 from formation of the dielectric liners 124 and unwanted conductive material over the top surface of the substrate 102 from formation of the electrically conductive central members 126 may be removed, for example using an etchback and/or chemical mechanical polish (CMP) process.

Figure 2D:
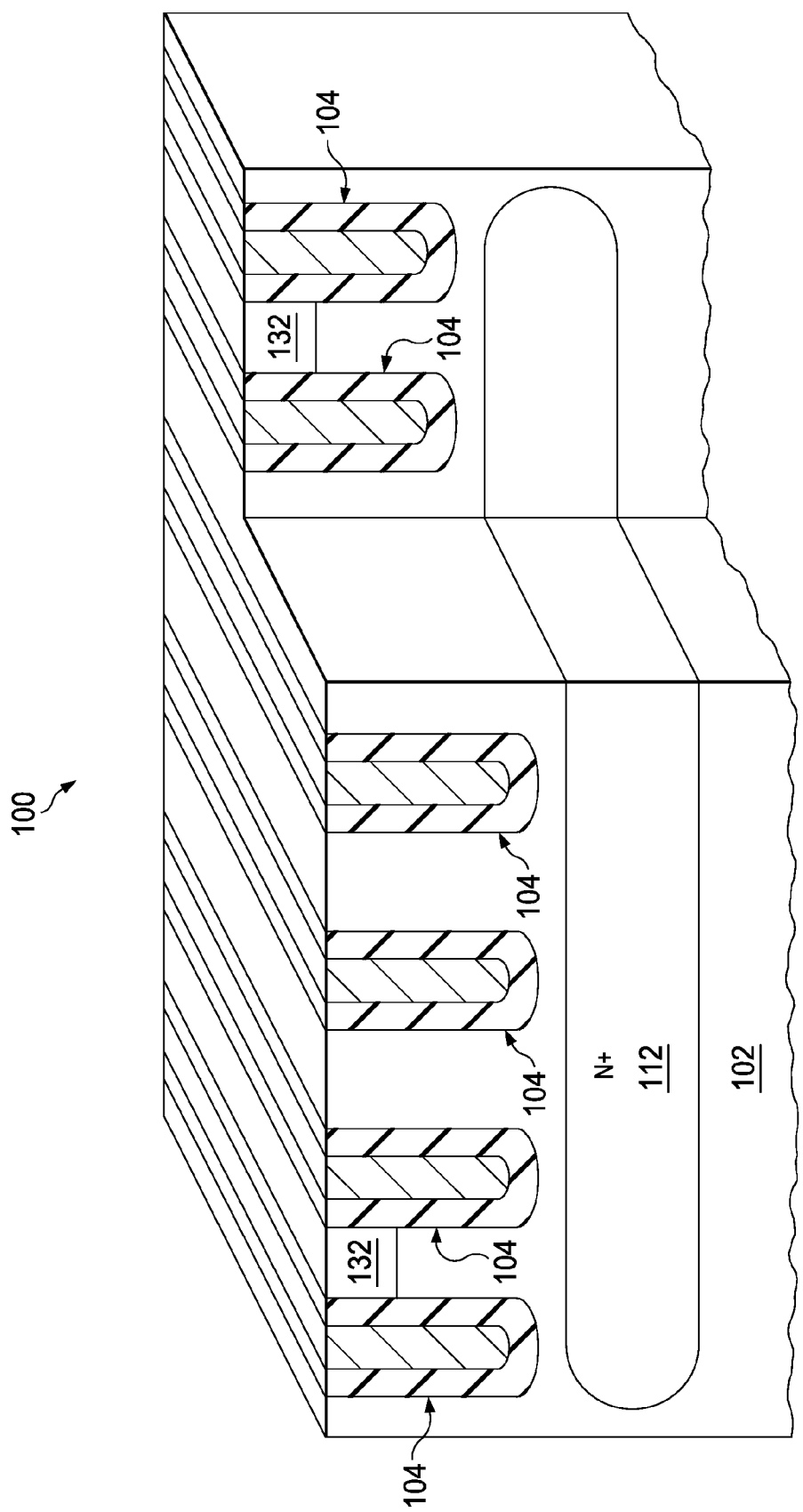

Referring to FIG. 2D, a drain contact ion implant process is performed which implants n-type dopants such as phosphorus into the substrate 102 in an area defined for the vertical drain contact region 106 of FIG. 1, to form a drain contact implanted region 132. A dose of the drain contact ion implant process may be, for example, $1 \times 10^{16}$ cm$^{-2}$ to $3 \times 10^{16}$ cm$^{-2}$.

Figure 2E:
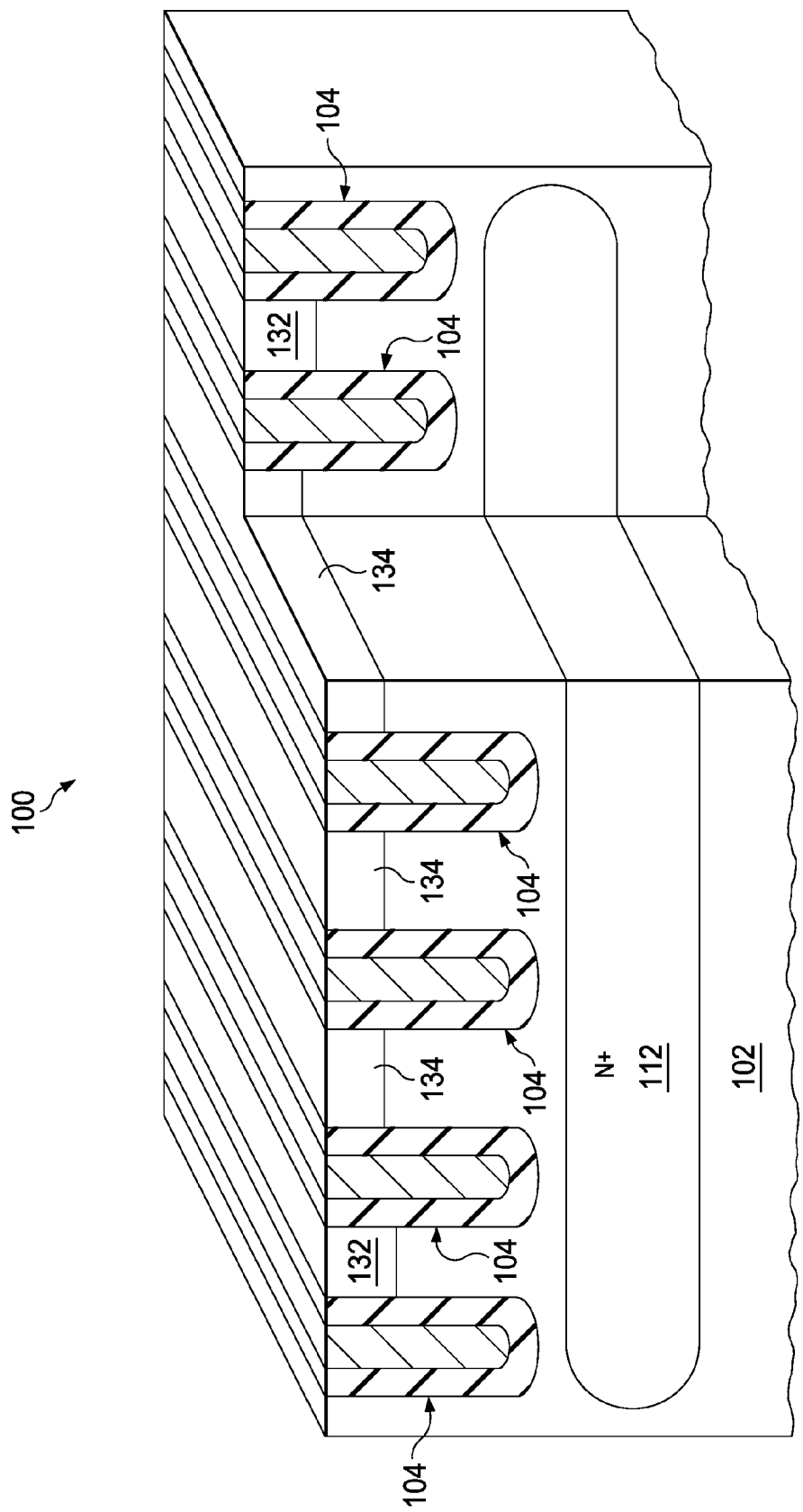

Referring to FIG. 2E, a drift region ion implant process is performed which implants n-type dopants such as phosphorus into the substrate 102 in and over an area defined for the vertically oriented drift regions 108 of FIG. 1, to form drift implanted regions 134. A dose of the drift region ion implant process may be, for example, $1 \times 10^{12}$ cm$^{-2}$ to $1 \times 10^{13}$ cm$^{-2}$. In one version of the instant embodiment, the drift implanted regions 134 may be confined to an area of the substrate between instances of the deep trench structures 104 abutting the vertically oriented drift regions 108, as depicted in FIG. 2E, by forming a drift region implant mask which blocks the substrate 102 outside the area defined for the deep trench structures 104. In an alternate version, the drift implanted regions 134 may extend into area of the substrate defined for the vertical drain contact region 106 of FIG. 1, possibly by performing the drift region ion implant process as a blanket implant process. A dose of the drain contact ion implant process is at least ten times higher than the drift region ion implant dose.

Figure 2F:
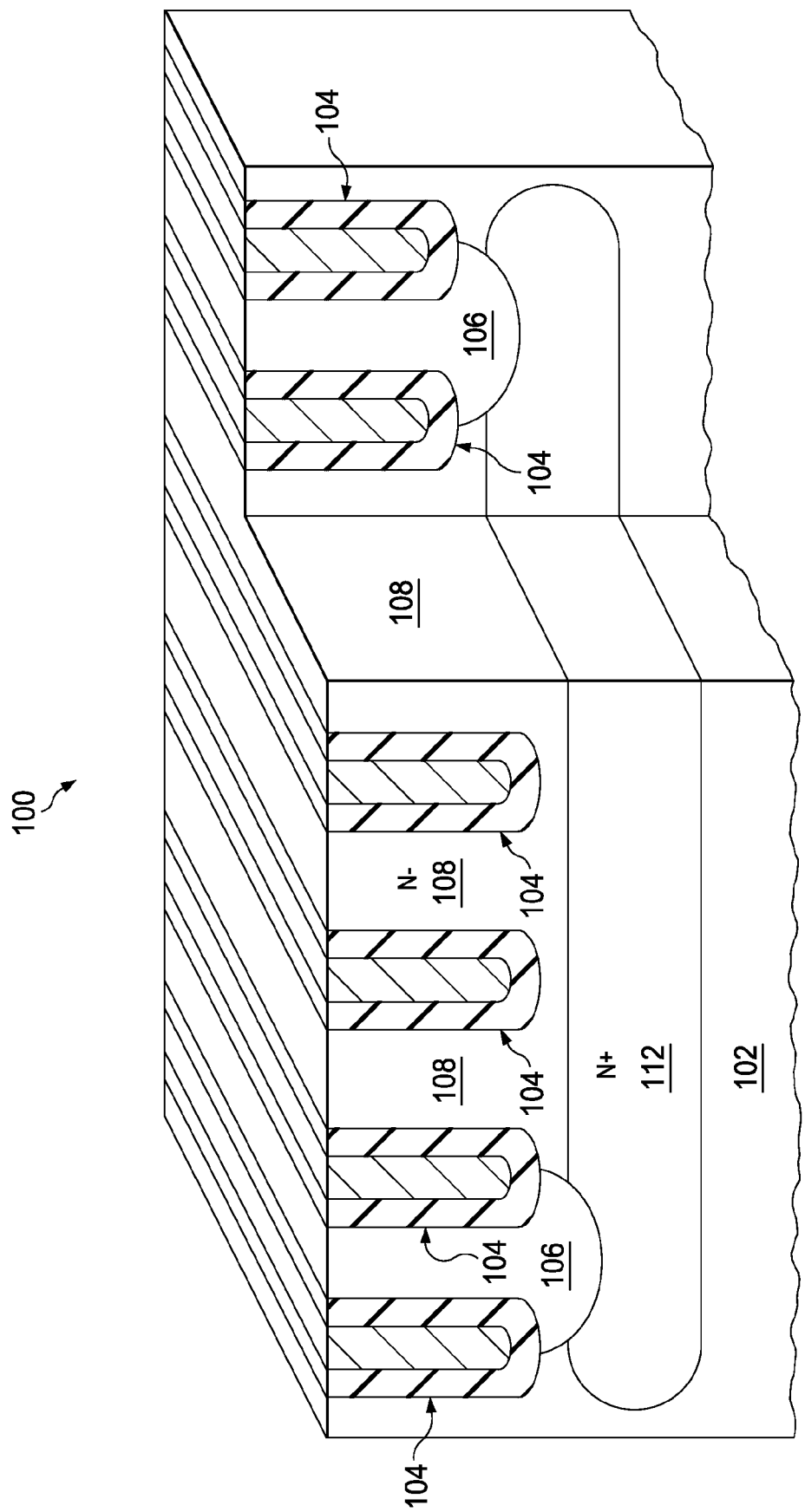

Referring to FIG. 2F, a thermal drive operation is performed which heats the substrate 102 so as to activate and diffuse the implanted dopants in the drift implanted regions 134 and the drain contact implanted region 132 and thereby form the vertically oriented drift regions 108 and the vertical drain contact region 106, respectively. Conditions of the thermal drive operation depend on a depth of the deep trench structures 104 and a desired lateral extent of the vertical drain contact region 106 at the bottoms of the deep trench structures 104. For example, a vertical drain extended MOS transistor 110 with deep trench structures 104 that are 2.5 microns deep may have a thermal drive operation which heats the substrate 102 at 1100° C. for 3.5 to 4 hours, or equivalent anneal conditions, for example, 1125° C. for 2 hours, or 1050° C. for 12 hours.

Figure 2G:
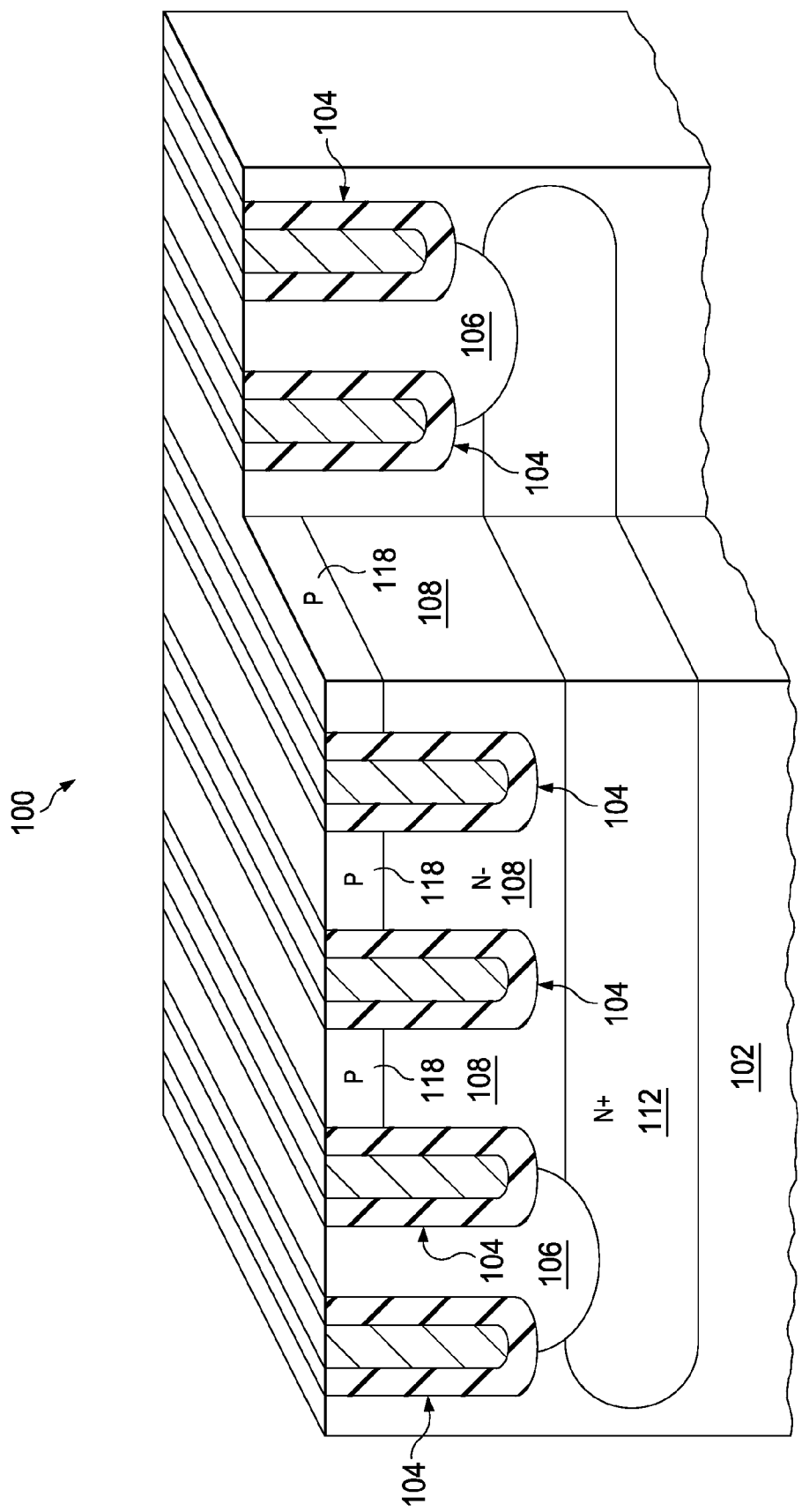

Referring to FIG. 2G, the at least one p-type body region 118 is formed over the vertically oriented drift regions 108. The body region 118 may be formed, for example, by forming a photoresist implant mask over the top surface of the substrate 102 and implanting p-type dopants such as boron into the vertically oriented drift regions 108, at a dose of $1 \times 10^{13}$ cm$^{-2}$ to $5 \times 10^{13}$ cm$^{-2}$. The implanted p-type dopants may subsequently be activated by an anneal process, for example 1000° C. for 60 seconds in a rapid thermal processor (RTP) tool, or equivalent anneal conditions, such as 1025° C. for 30 seconds, or 975° C. for 100 seconds. Alternatively, a blanket body implant may be performed which implants p-type body dopants into the substrate 102, including the vertically oriented drift regions 108 and the deep trench structures 104.

Figure 2H:
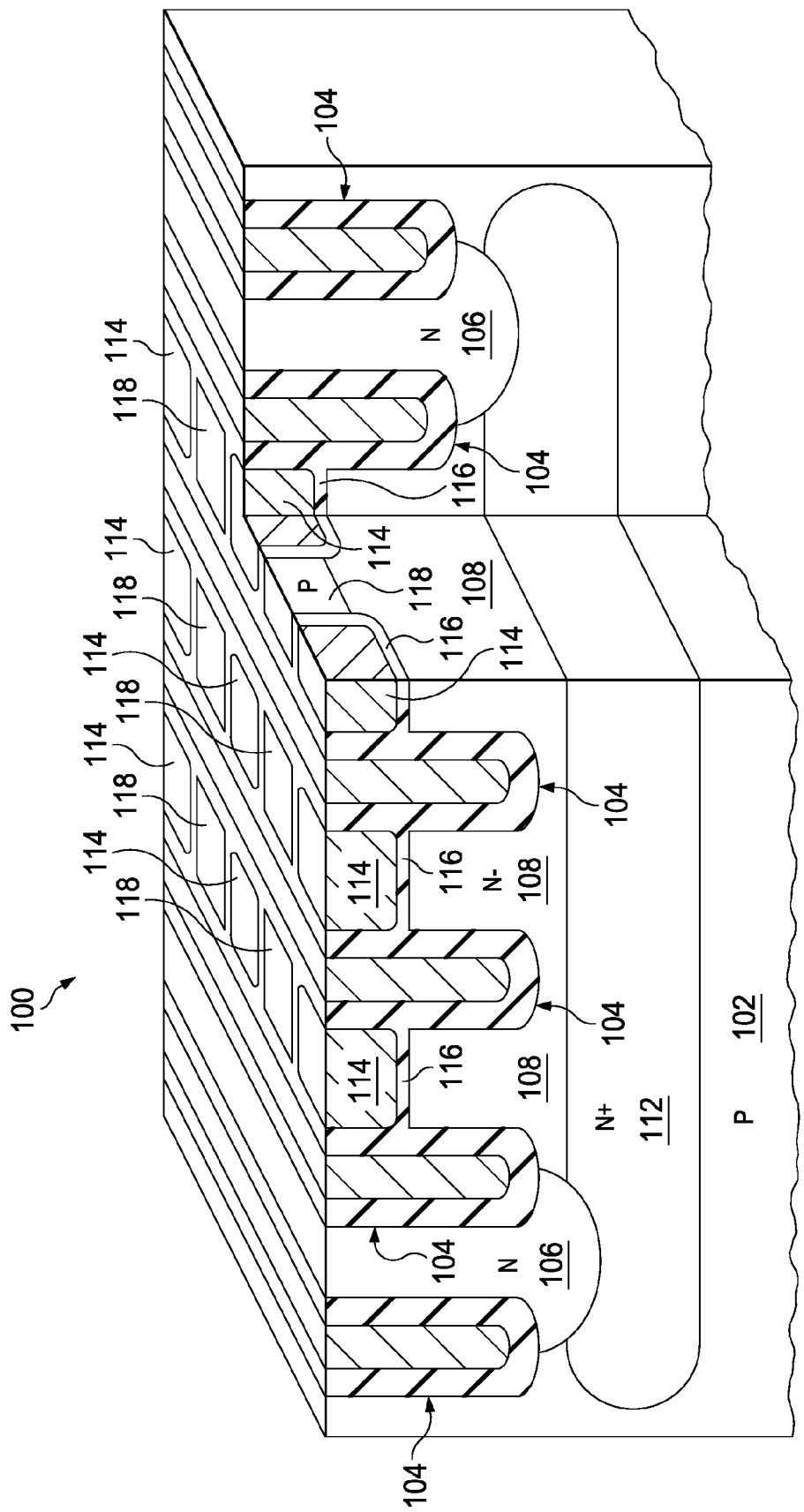

Referring to FIG. 2H, the trench gates 114 and gate dielectric layers 116 are formed in gate trenches in the substrate 102 over the vertically oriented drift regions 108 so that the gate dielectric layers 116 abut the body region 118. The gate trenches may be formed by forming a hard mask layer over the substrate 102 and patterning the hardmask layer using a photoresist etch mask and etching the hard mask layer to form a gate trench hard mask. The gate trenches may then be etched using a timed RIE process. A subsequent wet clean operation such as a dilute hydrofluoric acid clean may remove unwanted residue from the gate trenches produced by the RIE process.

The gate dielectric layers 116 are formed on sides and bottoms of the gate trenches. The gate dielectric layers 116 may be one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layers 116 may include nitrogen as a result of exposure to a nitrogen-containing plasma or a nitrogen-containing ambient gas at temperatures of 50 C to 800 C. The gate dielectric layers 116 may be formed by any of a variety of gate dielectric formation processes, for example thermal oxidation, plasma nitridation of an oxide layer, and/or dielectric material deposition by atomic layer deposition (ALD). A thickness of the gate dielectric layers 116 may be 2.5 to 3.3 nanometers per volt of gate-source bias on the vertical drain extended MOS transistor 110. For example, an instance of the vertical drain extended MOS transistor 110 operating with 30 volts on the trench gates 114 relative to the source regions 120 may have the gate dielectric layers 116 with a thickness of 75 to 100 nanometers.

Subsequently, the trench gates 114 are formed on the gate dielectric layers 116, for example by forming a layer of polysilicon conformably in the gate trenches on the gate dielectric layers 116 and over the substrate 102, followed by removing unwanted polysilicon from areas outside the gate trenches. Other gate materials may be used, including fully silicided polysilicon, replacement metal such as titanium nitride. In an alternate version of the instant example, the body region 118 may be formed after etching the gate trenches and forming the trench gates 114.

Figure 3:
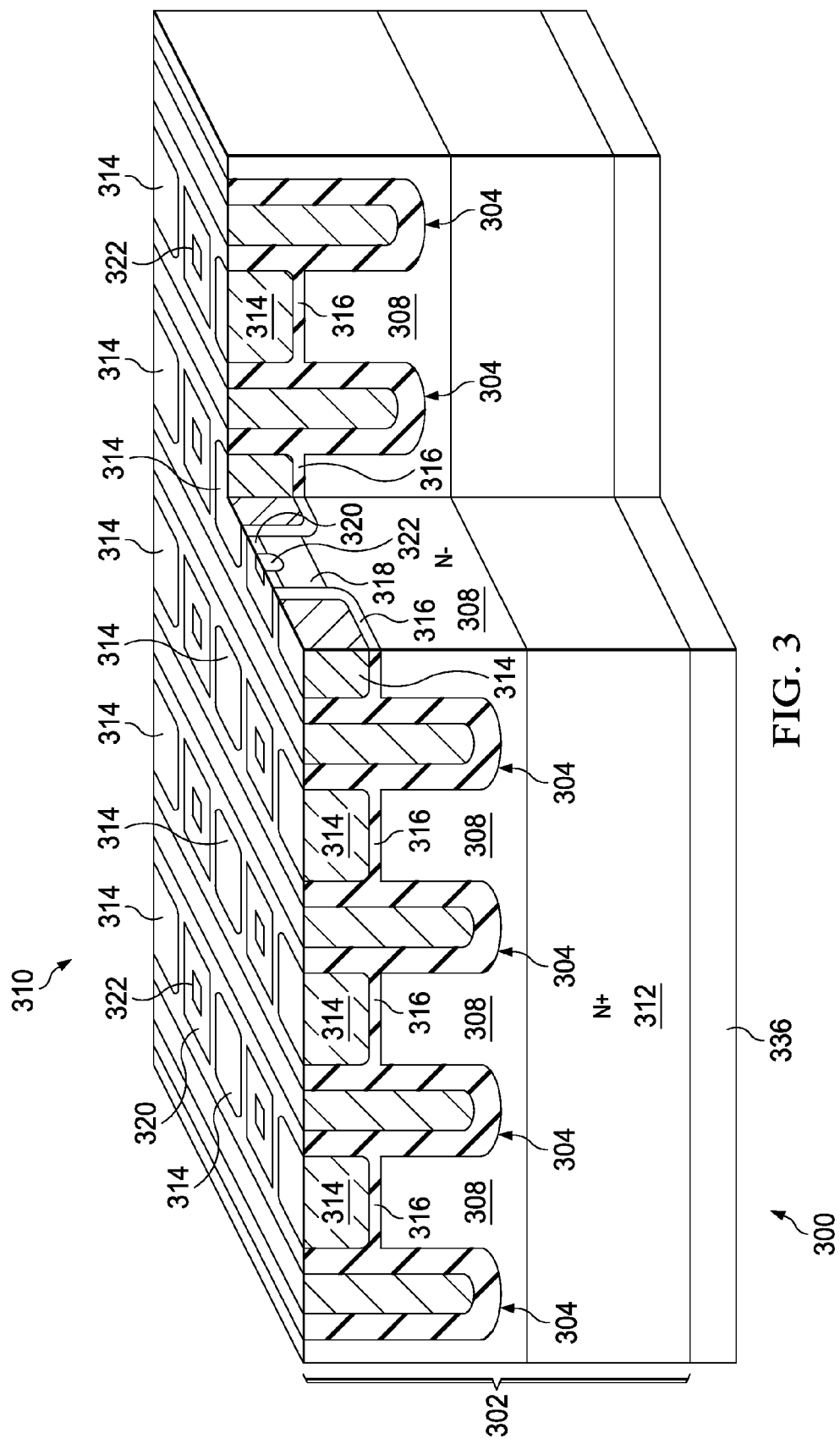
FIG. 3 is a cross section of a semiconductor device having a vertical drain extended MOS transistor.

FIG. 3 is a cross section of a semiconductor device having a vertical drain extended MOS transistor. The semiconductor device 300 may be formed in and on a p-type semiconductor substrate 302 as described in reference to FIG. 2A. An n-type buried layer 312 is formed in the substrate 302, possibly as described in reference to FIG. 2A and FIG. 2B. Alternatively, the n-type buried layer 312 may be formed by a blanket n-type epitaxial process followed by a p-type epitaxial process to produce the n-type buried layer everywhere in the semiconductor device 300. In a further version of the instant example, the substrate 302 may be an n-type wafer with a p-type epitaxial layer formed on a top surface of the n-type wafer.

A plurality of deep trench structures 304 are subsequently formed, for example as described in reference to FIG. 2C. A plurality of adjacent n-type vertically oriented drift regions 308 are subsequently formed, separated by instances of the deep trench structures 304 as described in reference to FIG. 1. Trench gates 314 and corresponding gate dielectric layers 316 are formed in trenches in the vertically oriented drift regions 308, so that top portions of the vertically oriented drift regions 308 contact bottom portions of the gate dielectric layers 316. At least one p-type body region 318 is disposed in the substrate 302 over the vertically oriented drift regions 308 and contacting the gate dielectric layers 316. N-type source regions 320 are disposed in the substrate 302 contacting the at least one p-type body region 318 and the gate dielectric layers 316. Optional p-type body contact regions 322 may be disposed in the substrate 302 contacting the at least one p-type body region 318.

In one version of the instant example, material may be removed from a bottom portion of the substrate 302 to provide a thinned substrate as depicted in FIG. 3, for example 50 to 250 microns thick, in which the n-type buried layer 312 extends to a bottom surface of the thinned substrate 302. In another version, the substrate 302 may remain substantially at a starting thickness.

A drain contact metal layer 336 is formed on a bottom surface of the substrate 302. The thus formed vertical drain extended MOS transistor 310 has a vertical configuration, in which drain connection is made at a bottom of the transistor 310 and source connection is made at a top of the transistor 310, advantageously providing higher drain current capacity than a topside drain connection configuration.

Figure 4:
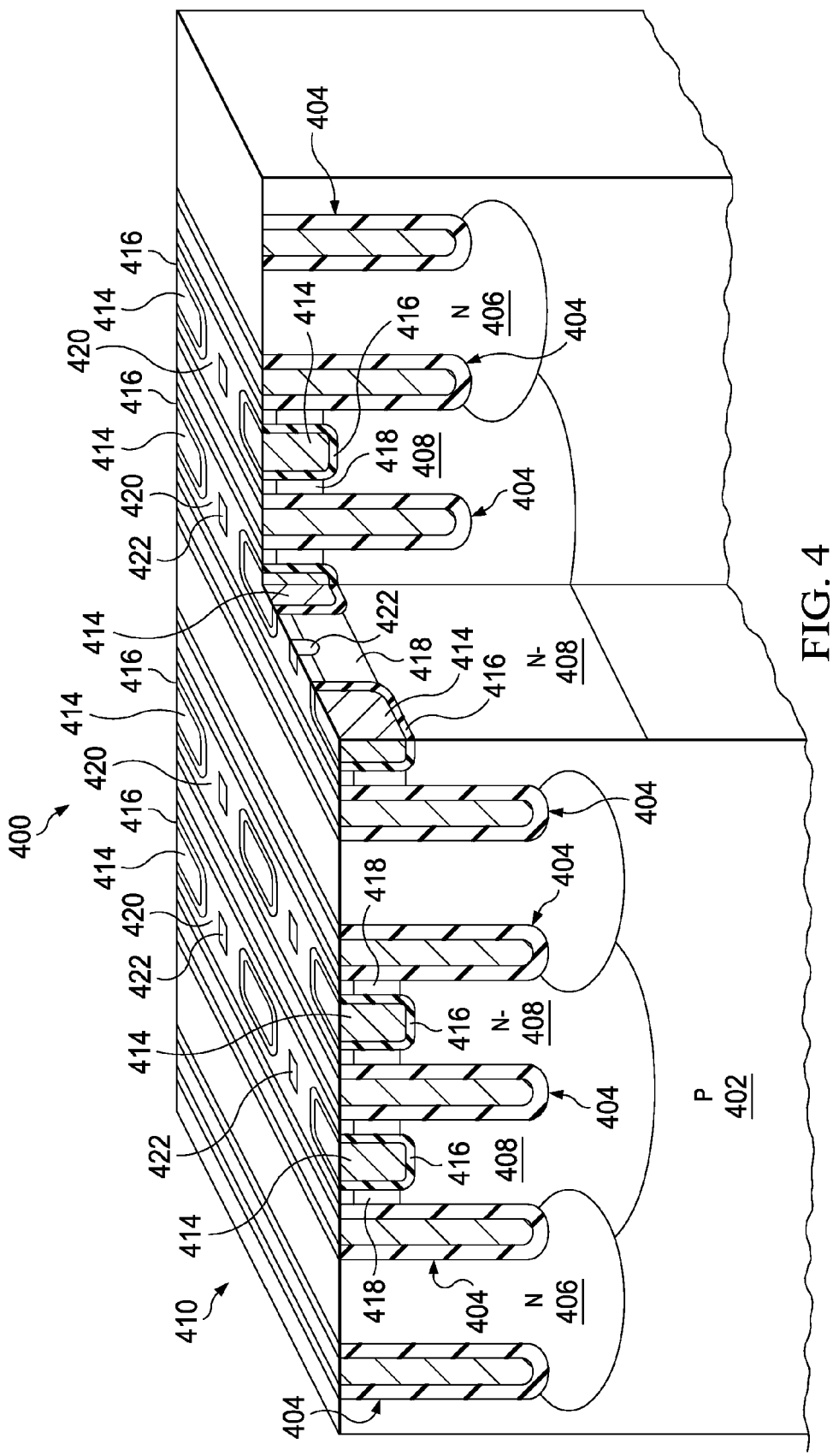
FIG. 4 is a cross section of a semiconductor device having a vertical drain extended MOS transistor.

FIG. 4 is a cross section of a semiconductor device having a vertical drain extended MOS transistor. The semiconductor device 400 is formed in and on a p-type semiconductor substrate 402 as described in reference to FIG. 2A. Deep trench structures 404 are disposed in the substrate 402 as described in reference to FIG. 2A and FIG. 2B, so as to define a plurality of vertical drain contact regions 406 and a plurality of vertically oriented drift regions 408 of the vertical drain extended MOS transistor 410. The vertical drain contact regions 406 are bounded on at least two opposite sides by the deep trench structures 404. Each vertically oriented drift region 408 is adjacent to at least one deep trench structure 404, as depicted in FIG. 4. In another version of the instant example, every vertically oriented drift region 408 may be adjacent to two instances of the deep trench structures 404. The vertical drain contact regions 406 extend below the deep trench structures 404 and makes contact to the adjacent vertically oriented drift regions 408. In the instant example, the vertical drain extended MOS transistor 410 is free of an n-type buried layer which extends under the vertically oriented drift regions 408, which may advantageously simplify fabrication of the semiconductor device 400.

Trench gates 414 and corresponding gate dielectric layers 416 are disposed in trenches in the vertically oriented drift regions 408, so that top portions of the vertically oriented drift regions 408 contact bottom portions of the gate dielectric layers 416. The trench gates 414 may be confined to a central portion of the vertically oriented drift regions 408 as shown in FIG. 4. At least one p-type body region 418 is disposed in the substrate 402 over the vertically oriented drift regions 408 and contacting the gate dielectric layers 416. N-type source regions 420 are disposed in the substrate 402 contacting the at least one p-type body region 418 and the gate dielectric layers 416. Optional p-type body contact regions 422 may be disposed in the substrate 402 contacting the at least one p-type body region 418. It will be recognized that other configurations of trench gates may be used in the vertical drain extended MOS transistor 410 of FIG. 4

Figure 5:
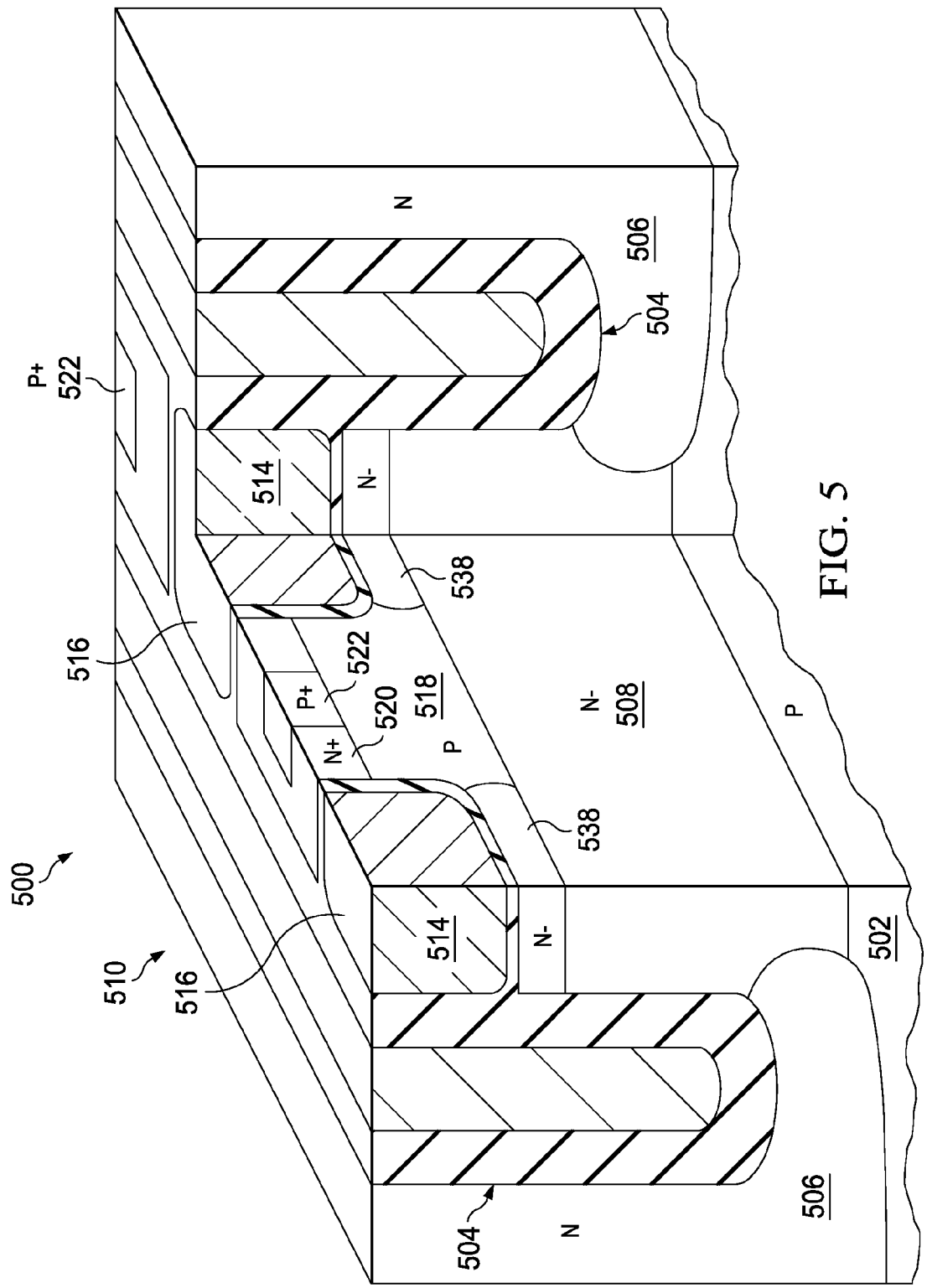
FIG. 5 is a cross section of a semiconductor device having a vertical drain extended MOS transistor.

FIG. 5 is a cross section of a semiconductor device having a vertical drain extended MOS transistor. The semiconductor device 500 is formed in and on a p-type semiconductor substrate 502 as described in reference to FIG. 2A. Deep trench structures 504 are disposed in the substrate 502 as described in reference to FIG. 2A and FIG. 2B, so as to define at least one vertical drain contact region 506 and at least one vertically oriented drift regions 508 of the vertical drain extended MOS transistor 510. The vertical drain contact region 506 is bounded on at least two opposite sides by the deep trench structures 504. Optionally, an n-type buried layer may be disposed in the substrate 502, extending under the vertically oriented drift regions 508.

Trench gates 514 and corresponding gate dielectric layers 516 are disposed in trenches in the vertically oriented drift regions 508. The trench gates 514 may be confined to a central portion of the vertically oriented drift regions 508 as shown in FIG. 5. At least one p-type body region 518 is disposed in the substrate 502 over the vertically oriented drift regions 508 and contacting the gate dielectric layers 516. N-type source regions 520 are disposed in the substrate 502 contacting the at least one p-type body region 518 and the gate dielectric layers 516. Optional p-type body contact regions 522 may be disposed in the substrate 502 contacting the at least one p-type body region 518.

In the instant example, the vertically oriented drift regions 508 are below the gate dielectric layers 516 and do not directly contact the gate dielectric layers 516. N-type drift region links 538 are disposed under, and contacts, the gate dielectric layers 516 and extends down to, and contacts, the vertically oriented drift regions 508. During operation of the vertical drain extended MOS transistor 510, the drift region links 538 provide a portion of an electrical connections between the vertical drain contact regions 506 and channels in the body region 518. The drift region links 538 may be formed, for example, by ion implanting n-type dopants into the substrate 502 after the gate trenches are etched and before gate material is formed in the gate trenches. The configuration of FIG. 5 may advantageously provide more repeatable gate lengths of the vertical drain extended MOS transistor 510 during production fabrication, because the gate lengths are determined by depths of the gate trenches and depths of the source regions 520. Variations in depths of the body region 518 thus do not cause significant variations in the gate lengths. It will be recognized that other configurations of trench gates may be used in the vertical drain extended MOS transistor 510 of FIG. 5.

Figure 6:
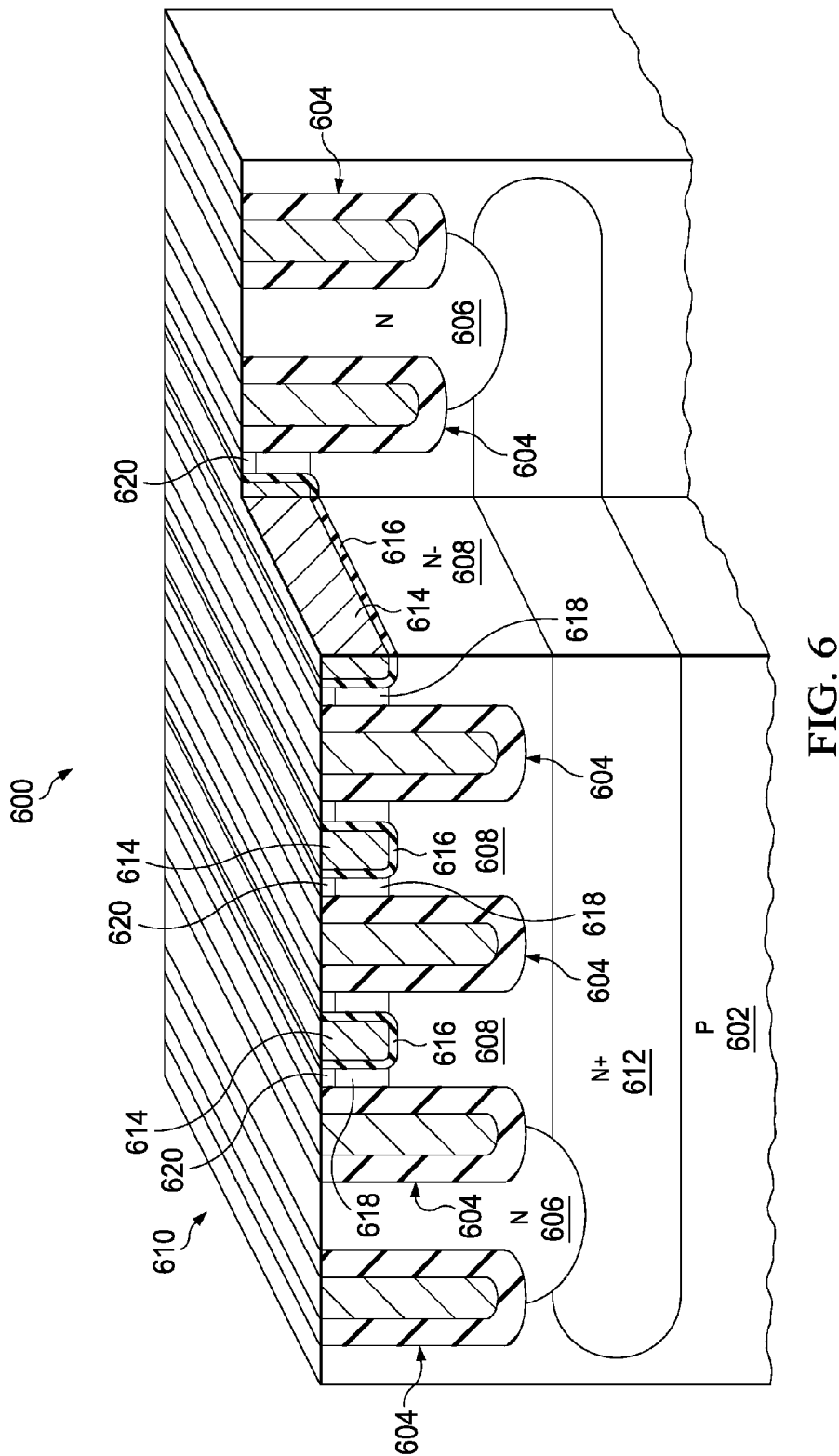
FIG. 6 is a cross section of a semiconductor device having a vertical drain extended MOS transistor.

FIG. 6 is a cross section of a semiconductor device having a vertical drain extended MOS transistor. The semiconductor device 600 is formed in and on a p-type semiconductor substrate 602 as described in reference to FIG. 2A. Deep trench structures 604 are disposed in the substrate 602 as described in reference to FIG. 2A and FIG. 2B, so as to define at least one vertical drain contact region 606 and at least one vertically oriented drift regions 608 of the vertical drain extended MOS transistor 610. The vertical drain contact regions 606 are bounded on at least two opposite sides by the deep trench structures 604. The vertical drain contact regions 606 extend below the deep trench structures 604. Optionally, an n-type buried layer 612 may be disposed in the substrate 602, extending under the vertically oriented drift regions 608; the vertical drain contact regions 606 contact the n-type buried layer 612 to provide a drain connection to the vertically oriented drift regions 608. Alternatively, each vertically oriented drift region 608 may possibly be adjacent to at least one deep trench structure 604, as described in reference to FIG. 4, obviating the need for the n-type buried layer 612.

Long trench gates 614 and corresponding gate dielectric layers 616 are disposed in long trenches in the vertically oriented drift regions 608, so that top portions of the vertically oriented drift regions 608 contact bottom portions of the gate dielectric layers 616. The long trench gates 614 are confined to a central portion of the vertically oriented drift regions 608 as shown in FIG. 6. At least one p-type body region 618 is disposed in the substrate 602 over the vertically oriented drift regions 608 and contacting the gate dielectric layers 616. N-type source regions 620 are disposed in the substrate 602 contacting the at least one p-type body region 618 and the gate dielectric layers 616. Long trench gates 614 may advantageously provide a desired value of specific resistivity, that is a product of on-state resistance and transistor area, for the vertical drain extended MOS transistor 610.

Figure 7:
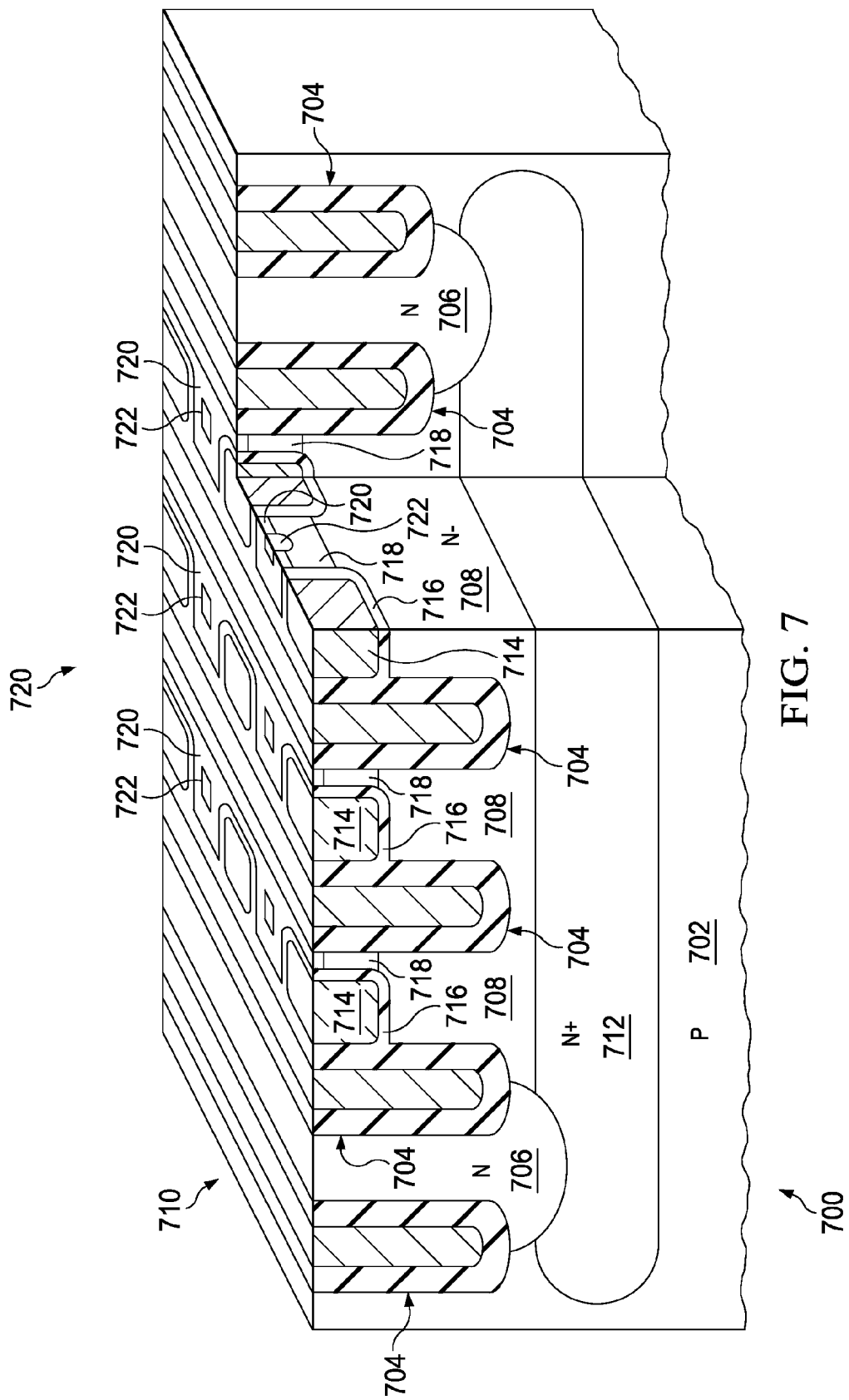
FIG. 7 is a cross section of a semiconductor device having a vertical drain extended MOS transistor.

FIG. 7 is a cross section of a semiconductor device having a vertical drain extended MOS transistor. The semiconductor device 700 is formed in and on a p-type semiconductor substrate 702 as described in reference to FIG. 2A. Deep trench structures 704 are disposed in the substrate 702 as described in reference to FIG. 2A and FIG. 2B, so as to define at least one vertical drain contact region 706 and at least one vertically oriented drift regions 708 of the vertical drain extended MOS transistor 710. The vertical drain contact regions 706 are bounded on at least two opposite sides by the deep trench structures 704. The vertical drain contact regions 706 extend below the deep trench structures 704. Optionally, an n-type buried layer 712 may be disposed in the substrate 702, extending under the vertically oriented drift regions 708; the vertical drain contact regions 706 contact the n-type buried layer 712 to provide a drain connection to the vertically oriented drift regions 708. Alternatively, each vertically oriented drift region 708 may possibly be adjacent to at least one deep trench structure 704, as described in reference to FIG. 4, obviating the need for the n-type buried layer 712.

Trench gates 714 and corresponding gate dielectric layers 716 are disposed in trenches in the vertically oriented drift regions 708, so that top portions of the vertically oriented drift regions 708 contact bottom portions of the gate dielectric layers 716. The trench gates 714 extend partway across the vertically oriented drift regions 708 and abut the deep trench structures 704 on exactly one side of the vertically oriented drift regions 708. At least one p-type body region 718 is disposed in the substrate 702 over the vertically oriented drift regions 708 and contacting the gate dielectric layers 716. N-type source regions 720 are disposed in the substrate 702 contacting the at least one p-type body region 718 and the gate dielectric layers 716. Optional p-type body contact regions 722 may be disposed in the substrate 702 contacting the at least one p-type body region 718. The trench gates 714 may be short trench gates as depicted in FIG. 7, or may be long trench gates similar to the long trench gates described in reference to FIG. 6. Forming the trench gates to abut the deep trench structures 704 on exactly one side of the vertically oriented drift regions 708 may provide a desired balance between operating voltage and specific resistivity for the vertical drain extended MOS transistor 710.

Figure 8:
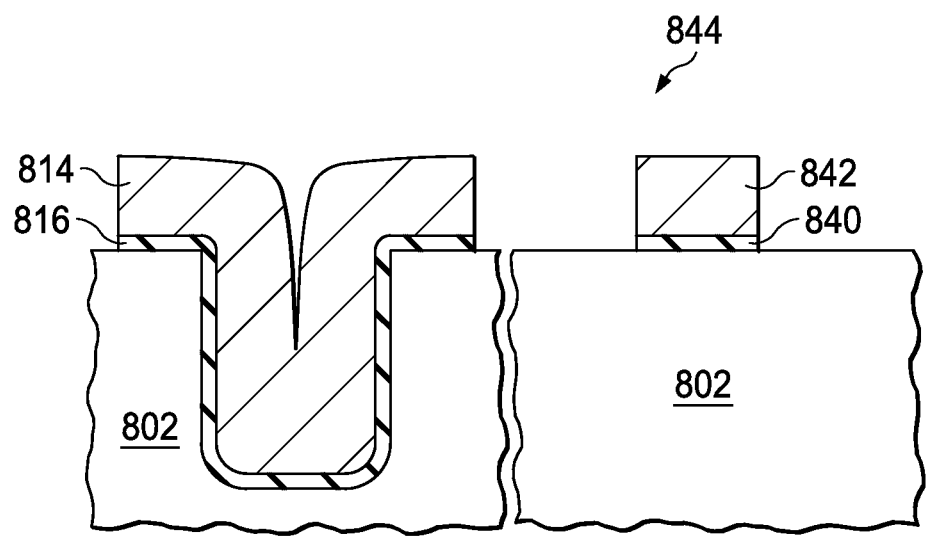
FIG. 8 and FIG. 9 are cross sections of different configurations of trench gates disposed in trenches.
Figure 9:
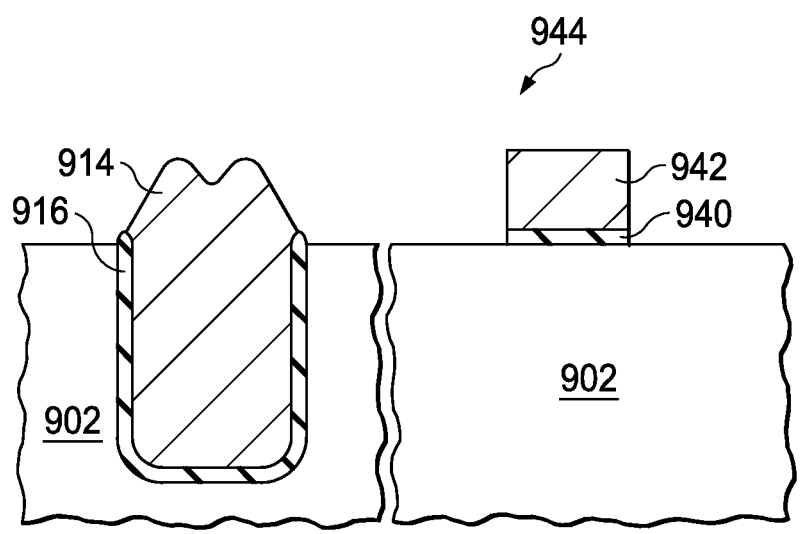

FIG. 8 and FIG. 9 are cross sections of different configurations of trench gates disposed in trenches. Referring to FIG. 8, a trench gate 814 and gate dielectric layer 816 are formed in a gate trench in a substrate 802 The gate dielectric layer 816 and the trench gate 814 overlap a top surface of the substrate 802, for example by at least 500 nanometers, which may simplify fabrication of the trench gate 814. The trench gate 814 may be formed by an RIE process using a photolithograpically defined etch mask. The gate dielectric layer 816 and the trench gate 814 may be formed concurrently with a transistor gate dielectric layer 840 and a transistor gate 842 of a planar MOS transistor 844.

Referring to FIG. 9, a trench gate 914 and gate dielectric layer 916 are formed in a gate trench in a substrate 902. The trench gate 914 extends above, but does not overlap, a top surface of the substrate 902. This may be accomplished by patterning the trench gate 914 with an RIE process using a photolithograpically defined etch mask, followed by an isotropic etchback process. The trench gate 914 configuration may advantageously reduce unwanted capacitance between the trench gate 914 and the substrate 902 without requiring a CMP process. The gate dielectric layer 916 and the trench gate 914 may be formed concurrently with a transistor gate dielectric layer 940 and a transistor gate 942 of a planar MOS transistor 944.

Figure 10:
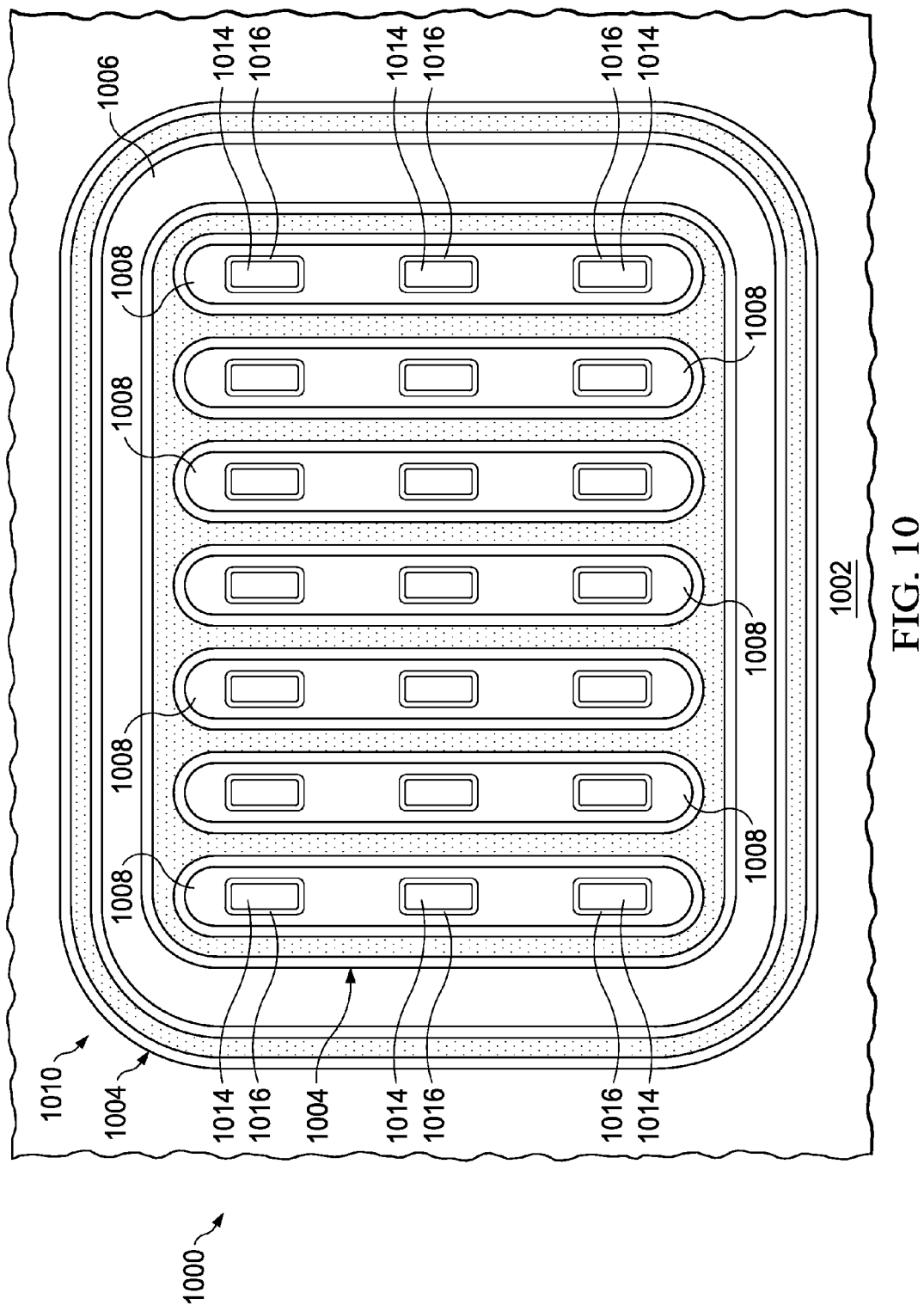
FIG. 10 through FIG. 12 are top views of semiconductor devices having vertical drain extended MOS transistors.
Figure 11:
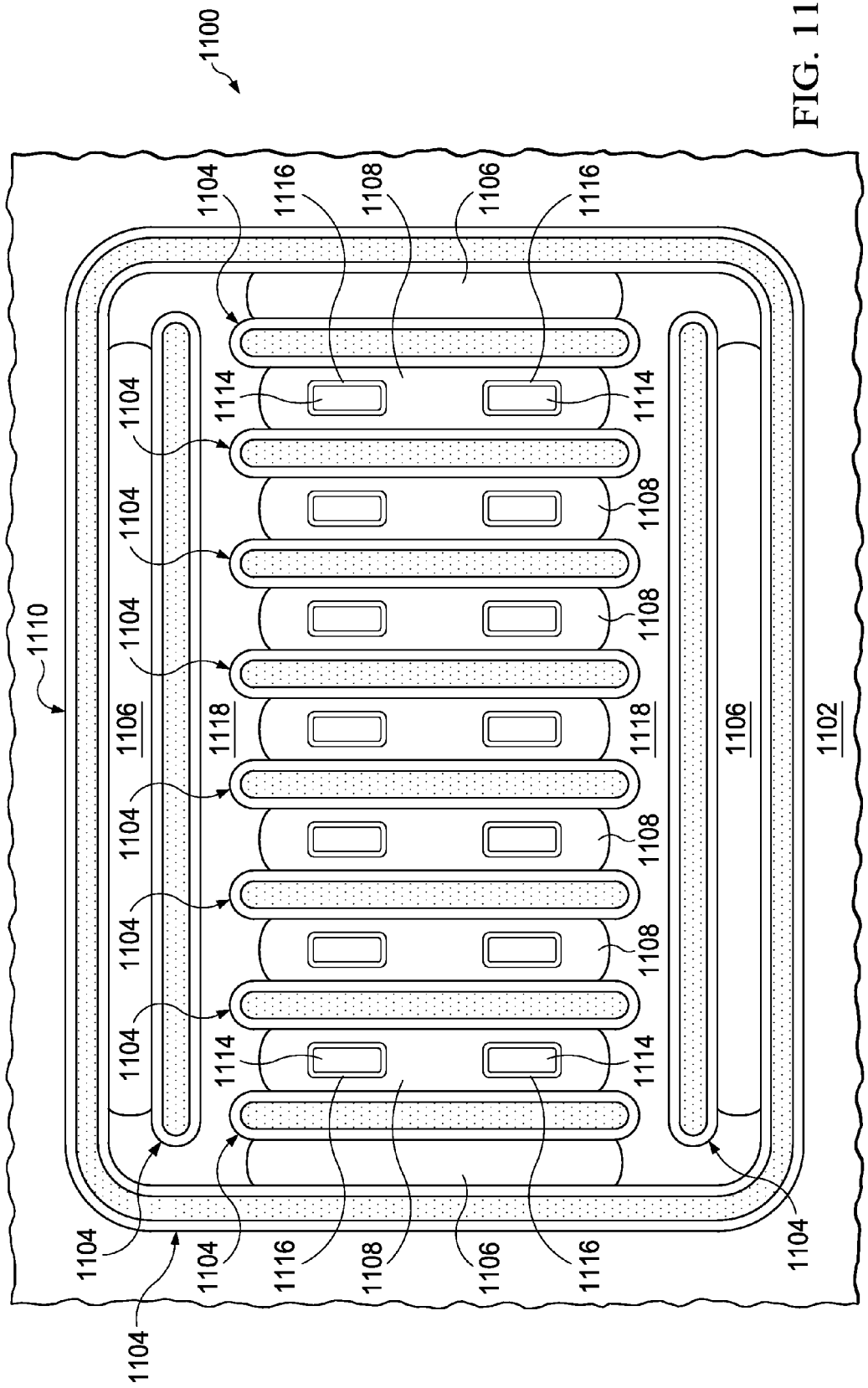
Figure 12:
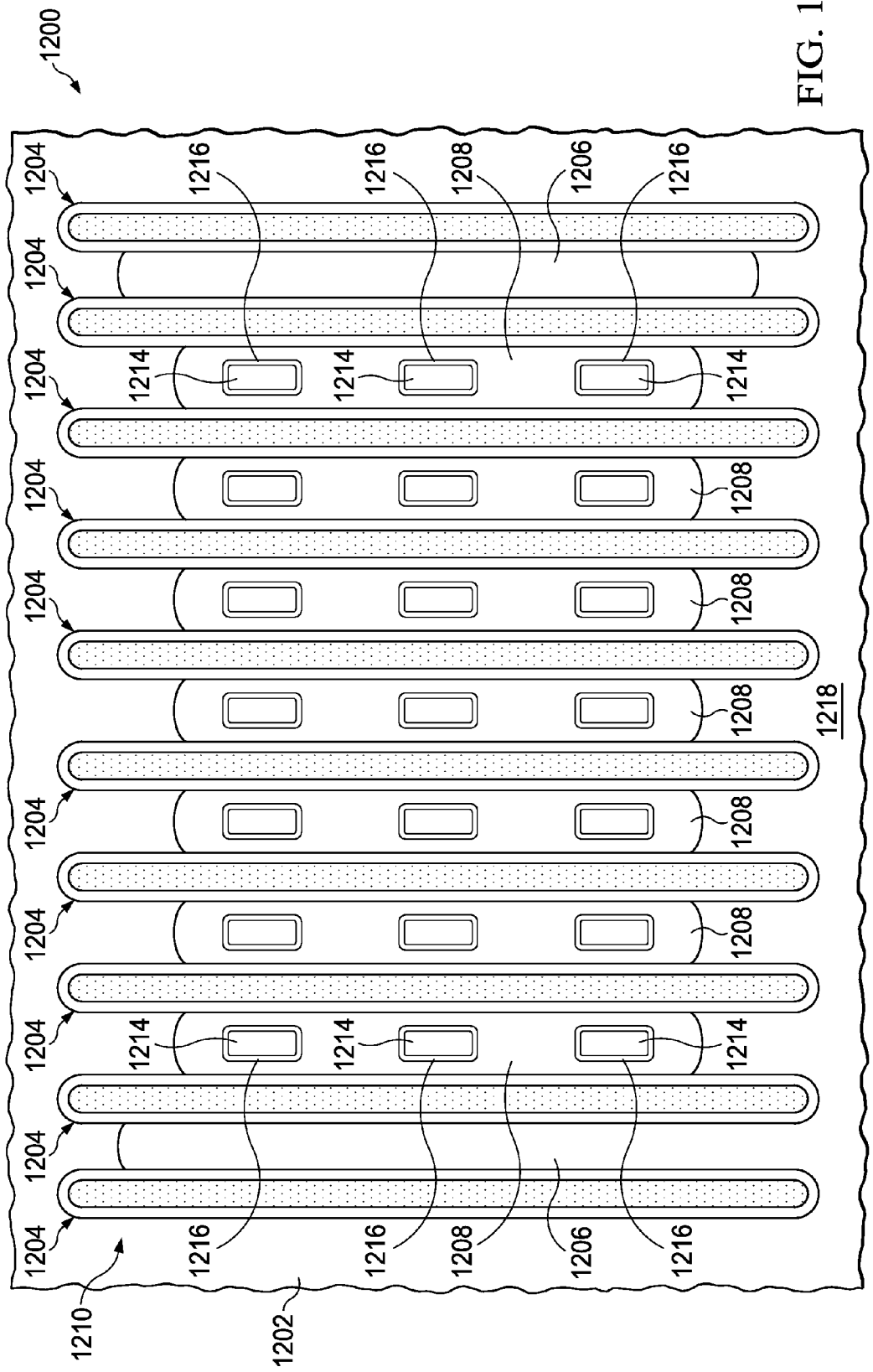

FIG. 10 through FIG. 12 are top views of semiconductor devices having vertical drain extended MOS transistors. Trench gates depicted in FIG. 10 through FIG. 12 are confined to a central portion of the vertically oriented drift regions as discussed in reference to FIG. 4, but it will be recognized that other configurations of gates may be used in the examples depicted. Referring to FIG. 10, the semiconductor device 1000 is formed in and on a semiconductor substrate 1002 as described in reference to FIG. 2A. A deep trench structure 1004 encloses a plurality of adjacent vertical drift regions 1008. Each vertical drift region 1008 includes at least one gate 1014 and gate dielectric layer 1016. A vertical drain contact region 1006 surrounds the plurality of adjacent vertical drift regions 1008. The vertical drift regions 1008 and the surrounding vertical drain contact region 1006 are n-type; an n-type region extends under the plurality of adjacent vertical drift regions 1008 to provide an electrical connection to the surrounding vertical drain contact region 1006. Another instance of the deep trench structures 1004 laterally surrounds the vertical drain extended MOS transistor 1010. Electrical connection to the vertical drain contact region 1006 is made at a top surface of the substrate 1002. Configuring the vertical drift regions 1008 adjacent to each other may advantageously reduce an area required for the vertical drain extended MOS transistor 1010, thereby reducing a fabrication cost of the semiconductor device 1000.

Referring to FIG. 11, the semiconductor device 1100 is formed in and on a semiconductor substrate 1102 as described in reference to FIG. 2A. A plurality of deep trench structures 1104 with linear configurations is disposed in the substrate, with vertical drift regions 1108 disposed between adjacent pairs of the linear deep trench structures 1104, so that each adjacent pair of vertical drift regions 1108 is separated by exactly one deep trench structure 1104. Each vertical drift region 1108 includes at least one gate 1114 and gate dielectric layer 1116. Instances of vertical drain contact regions 1106 with linear configurations surround the vertical drift regions 1108; each vertical drain contact region 1106 is separated from the vertical drift regions 1108 by a linear deep trench structure 1104. The vertical drift regions 1108 and the surrounding vertical drain contact regions 1106 are n-type; an n-type region extends under the plurality of vertical drift regions 1108 to provide an electrical connection to the surrounding vertical drain contact regions 1106. Another instance of the deep trench structures 1104 laterally surrounds the vertical drain extended MOS transistor 1110. Electrical connection to the vertical drain contact regions 1106 are made at a top surface of the substrate 1102. Configuring the vertical drift regions 1108 adjacent to each other may advantageously reduce an area required for the vertical drain extended MOS transistor 1110, thereby reducing a fabrication cost of the semiconductor device 1100. Configuring all the deep trench structures 1104 to be free of T-shaped branches may desirably simplify a fabrication sequence of the semiconductor device 1100, thereby advantageously further reducing the fabrication cost.

Referring to FIG. 12, the semiconductor device 1200 is formed in and on a semiconductor substrate 1202 as described in reference to FIG. 2A. A plurality of deep trench structures 1204 with linear configurations is disposed in the substrate, with vertical drift regions 1208 disposed between adjacent pairs of the linear deep trench structures 1204, so that each adjacent pair of vertical drift regions 1208 is separated by exactly one deep trench structure 1204. Each vertical drift region 1208 includes at least one gate 1214 and gate dielectric layer 1216. Instances of vertical drain contact regions 1206 with linear configurations parallel to the vertical drift regions 1208 are disposed proximate to a first instance and a last instance of the vertical drift regions 1208. Both vertical drain contact regions 1206 are disposed between two parallel linear instances of the deep trench structures 1204. The vertical drift regions 1208 and the surrounding vertical drain contact regions 1206 are n-type; an n-type region extends under the plurality of vertical drift regions 1208 to provide an electrical connection to the adjacent vertical drain contact regions 1206. In the instant example, the vertical drain extended MOS transistor 1210 is free of a surrounding instance of the deep trench structures 1204. Electrical connection to the vertical drain contact regions 1206 are made at a top surface of the substrate 1202. Configuring the vertical drain extended MOS transistor 1210 to be free of a surrounding instance of the deep trench structures 1204 may advantageously reduce an area required for the vertical drain extended MOS transistor 1210 compared to the configuration as depicted in FIG. 11, thereby reducing a fabrication cost of the semiconductor device 1200.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. A semiconductor device, comprising:
 a substrate comprising a semiconductor having a first conductivity type; and
 a vertical drain extended metal oxide semiconductor (MOS) transistor, including:
  a plurality of deep trench structures disposed in said substrate, at least one micron deep, having a dielectric liner abutting said substrate;

a vertically oriented drift region having a second conductivity type opposite from said first conductivity type, disposed in said substrate, abutting and being bounded on at least two opposite sides by said deep trench structures;

at least one trench gate on a gate dielectric layer disposed in a gate trench in said substrate over said vertically oriented drift region between two adjacent deep trench structures of said plurality of deep trench structures; and a body region having said first conductivity type disposed over said vertically oriented drift region and contacting said gate dielectric layer.

2. The semiconductor device of claim 1, in which said trench gate extends across said vertically oriented drift region and abuts said deep trench structures.

3. The semiconductor device of claim 1, in which said trench gate is laterally separated from said deep trench structures by a portion of said vertically oriented drift region.

4. A semiconductor device, comprising:

a substrate comprising a semiconductor having a first conductivity type; and a vertical drain extended metal oxide semiconductor (MOS) transistor, including:

a plurality of deep trench structures disposed in said substrate, at least one micron deep, having a dielectric liner abutting said substrate;

a vertically oriented drift region having a second conductivity type opposite from said first conductivity type, disposed in said substrate, abutting and being bounded on at least two opposite sides by said deep trench structures;

at least one trench gate on a gate dielectric layer disposed in a gate trench in said substrate over said vertically oriented drift region; and a body region having said first conductivity type disposed over said vertically oriented drift region and contacting said gate dielectric layer, in which said vertical drain extended MOS transistor further includes a buried layer having said second conductivity type disposed in said substrate, extending under said vertically oriented drift region.

5. The semiconductor device of claim 4, in which a drain contact metal layer is disposed on a bottom surface of said substrate.

6. The semiconductor device of claim 1, in which said vertical drain extended MOS transistor further includes at least one vertical drain contact region having said second conductivity type disposed in said substrate, said vertical drain contact region abutting and being bounded on at least two opposite sides by said deep trench structures, said vertical drain contact region extending below a bottom of said deep trench structure.

7. The semiconductor device of claim 1, in which a top surface of said trench gate is substantially even with a top surface of said substrate.

8. The semiconductor device of claim 1, in which said trench gate extends above a top surface of said substrate, but does not overlap said top surface of said substrate.

9. The semiconductor device of claim 1, in which said trench gate and said gate dielectric layer overlap a top surface of said substrate by at least 200 nanometers.

10. The semiconductor device of claim 1, in which said first conductivity type is p-type and said second conductivity type is n-type.

\* \* \* \* \*